(12) United States Patent
Liu

(10) Patent No.: US 6,316,727 B1
(45) Date of Patent: Nov. 13, 2001

(54) MULTI-CHIP SEMICONDUCTOR PACKAGE

(75) Inventor: Hermen Liu, Taoyuan Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/414,986

(22) Filed: Oct. 7, 1999

(51) Int. Cl.$^7$ .................................................. H01L 23/02

(52) U.S. Cl. ......................................... 174/52.4; 257/686

(58) Field of Search ...................... 174/52.4; 257/686, 257/711, 723

(56) References Cited

U.S. PATENT DOCUMENTS 5,422,435 * 6/1995 Takiar et al. .................... 174/52.4

* cited by examiner

*Primary Examiner*—Peter S. Wong
*Assistant Examiner*—Gary L. Laxton

(57) ABSTRACT

A multi-chip semiconductor package is described. By changing the design for a lead frame, two or more chips are packaged together. A die pad whose surface area is smaller than that of a chip is used so that bonding pads can be exposed and chips can mounted with the same direction. Therefore, wires are not crossed during wire bonding. Thus, chips do not need additional treatment. Performance and density of the package can be enhanced without increasing capital expenditure. Device integration is also increased.

8 Claims, 1 Drawing Sheet

MULTI-CHIP SEMICONDUCTOR PACKAGE

BACKGROUND OF THE INVENTION

1. Field of Invention

The present invention relates to a semiconductor package. More particularly, the present invention relates to a multi-chip semiconductor package.

2. Description of Related Art

In the semiconductor industry, the fabrication of integrated circuits is divided into three stages: the fabrication of wafers, the formation of integrated circuits, and the packaging of integrated circuits. The purpose of the packaging is to provide electrical connection between dies and a printed circuit board or other desired devices, as well as protection.

After the formation of integrated circuits, a wafer is cut into dies. In general, the dies have bonding pads thereon to provide die testing points, and to provide connection between the dies and other devices. In general, wires and bumps are provided to connect the dies and other devices.

FIG. 1 is a schematic, cross-sectional diagram of a conventional semiconductor package.

Referring to FIG. 1, a chip 100 is attached to a die pad 102, which is in the center region of a lead frame 104. Bonding pads 106 made of metal are mounted in one surface of the chip 100. The bonding pads 106 are used for coupling with other devices, and are typically made of aluminum. The surface of the chip 100 without bonding pads is fixed to the die pad 102 by an adhesive. After the chip 100 is fixed, each bonding pad 106 in the bonding pad surface of the chip 100 is coupled to each corresponding lead 110 by wires 108. The chip 100, wires 108, and a portion of the leads 110 are sealed in packaging material 112. The packaging material 112 fixes devices in their required positions and protects the chips 100 and the connection points of the chip 100 and the wires 108, and also prevents moisture from penetrating into the packaging. An exposed portion of the leads 110 is bent downward for coupling to a printed circuit board (not shown).

Increasing integration in integrated circuits creates increased requirements for packages. However, only one chip is packaged in a conventional package. Integration and performance are limited by only one chip in the conventional package so that the integration of devices and performance cannot be enhanced, and capital expenditure cannot be lowered. Therefore, it is important for the packaging industry to increase device integration and performance, and to further lower the capital expenditure.

SUMMARY OF THE INVENTION

The invention provides a multi-chip semiconductor package. The multi-chip package comprises a first chip, a second chip, a lead frame, a plurality of wires, and a packaging material. The first chip has a first surface and a second surface, and the first surface has a plurality of first bonding pads. The second chip has a third surface and a fourth surface, and the third surface has a plurality of second bonding pads. The lead frame comprises a die pad and a plurality of leads. The die pad has a fifth surface and a sixth surface, wherein the fifth surface is attached to the second surface and the sixth surface is attached to the third surface, and the die pad has an area smaller than that of the second chip so as to expose the second pads. The leads have an inner portion and an outer portion. The plurality of wires respectively couple the first bonding pads and the second bonding pads to the inner portion of the leads. The first chip, the second chip, and the inner portion of the leads are all sealed within the packaging material.

As embodied and broadly described herein, the invention provides a multi-chip semiconductor package, whose manufacturing method is easily combined with current package technology.

The invention changes the design for a lead frame by using a die pad whose surface area is smaller than that of a chip. Thus, chips do not need any additional treatment. Therefore, chips with the same layout can be used and manufacturing cost is low.

In the invention, more than two chips are packaged together. When this structure is employed in DRAM, the memory density is increased. Thus, device integration is increased, and performance is enhanced without re-designing and re-manufacturing chips. Therefore, the package described in the invention can be rapidly introduced to the market. Due to a decrease in the distance between devices, transmission speed is increased, and device performance is also enhanced.

The package in the invention can increase density and performance of chips and device integration without increasing capital expenditure.

The invention can be employed in a logic device; thus, chips with different functions are packaged together. Therefore, the functions of a package are increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In a conventional package, only one chip is packaged so that the function is limited. In order to satisfy the requirements of integration, the invention provides a multi-chip package. By changing the design for a lead frame, a die pad having a smaller area than that of a chip is used. Thus, more than two chips can be packaged together so as to increase density and performance. Two chips are illustrated in the following description in order to clearly describe the objective and the advantages of the invention.

Figure 1:
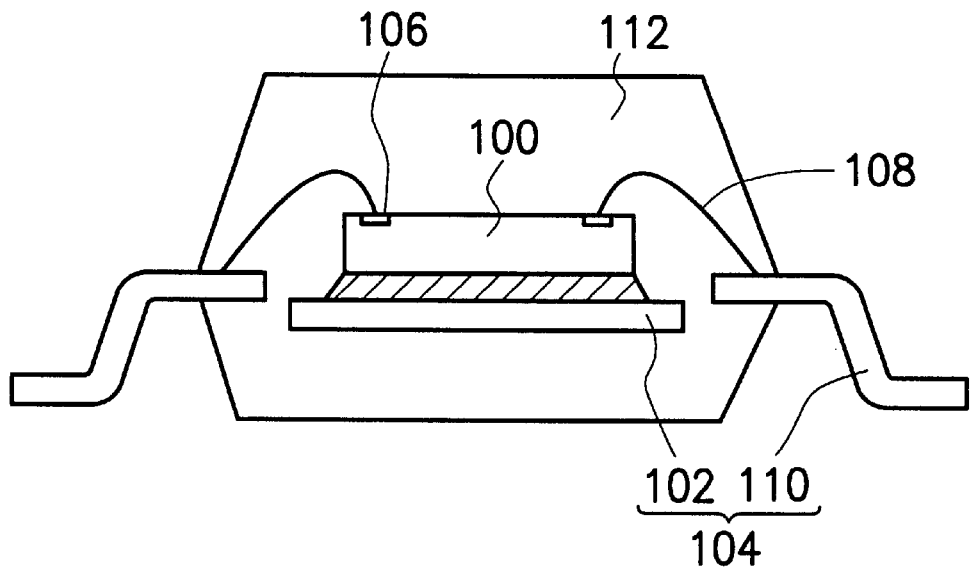
FIG. 1 is a schematic, cross-sectional diagram of a conventional semiconductor package.
Figure 2:
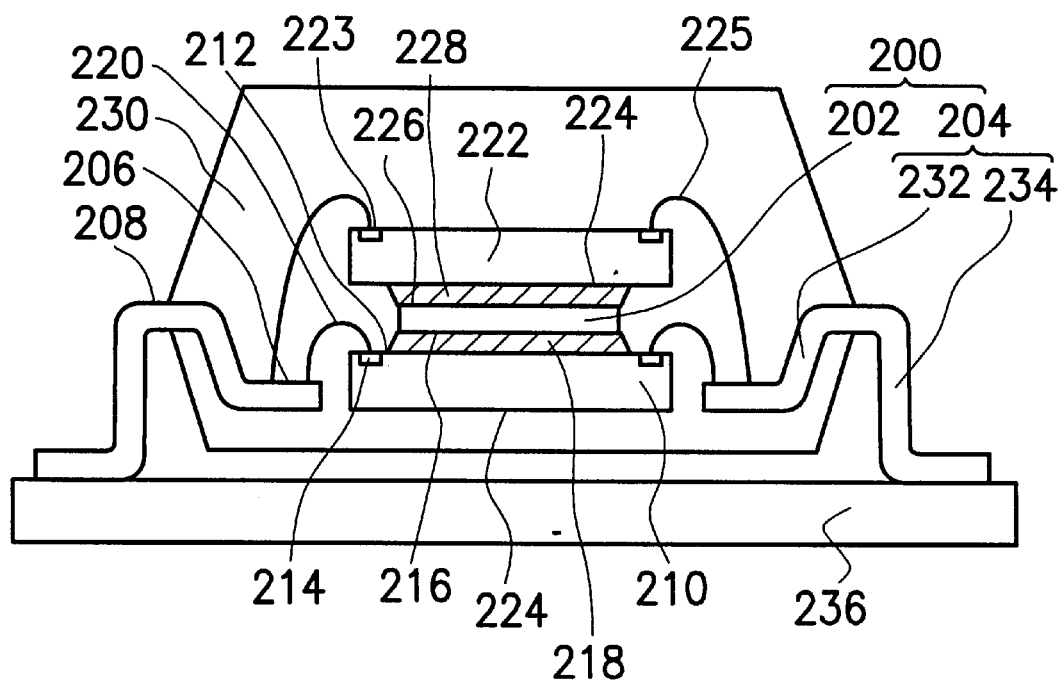
FIG. 2 is a schematic, cross-sectional diagram of a multi-chip package according to one preferred embodiment of this invention.

FIG. 2 is a schematic, cross-sectional diagram of a multi-chip package according to one preferred embodiment of this invention.

Referring to FIG. 2, a lead frame 200 is provided to serve as a carrier. The lead frame 200 comprises a die pad 202 and a lead 204. A portion of the lead 204 is bent downward so as to form a first plane 206 with a lower surface level and a second surface 208 with a higher surface level. The portion of the lead 204 is bent downward to advantage a subsequent wire bonding step. Persons skilled in the art should understand that this downsetting step for the lead 204 is not necessary.

Bonding pads 214 made of metal are mounted on a front surface 212 of a first chip 210. The bonding pads 214 are used for coupling with other devices, and are typically made of aluminum. The front surface 212 without bonding pads 214 is attached to a surface 216 of the die pad 202. The invention changes the design for the lead frame by using a die pad having a smaller area than that of a chip; that is, the surface 216 of the lead frame 202 is smaller than the front surface 212 of the first chip 210. Thus, the bonding pads 214 in the front surface 212 of the first chip 210 are exposed. The first chip 210 is attached to the die pad 202 by die-attaching material 218 such as an adhesive or an adhesive tape.

Bonding pads 214 on the first chip 210 are respectively coupled to the lower first plane 206 of the corresponding leads 204 by wires 220.

The back surface 224 of a second chip 222 is attached to the other surface 226 of the die pad 202. The surface 224 without bonding pads 223 is fixed by a die-attaching material 228 such as an epoxy or a tape. The first chip 210 can be the same as the second chip 222, for example, a DRAM chip, or the first chip 210 can be different from the second chip 222, for example, a memory chip, a logic chip or a flash memory chip.

Similarly, the bonding pads 223 on the second chip 222 are respectively coupled to the lower first plane 206 of the corresponding leads 204 by wires 225.

A portion of the leads 204 is bent downward to allow easy coupling with the first chip 210 by wires so that these chips can be fixed at the center portion of the package.

The first chip 210, the second chip 222, the wires 220, 225, and a portion of the leads 204 are sealed in a packaging material 230. The first plane 206 and a portion of the second plane 208 of the leads 204 are sealed within the packaging material 230. The packaging material 230 can fix devices in their required position and prevent moisture from penetrating into the package. The portion of each lead 204 sealed within the packaging material 230 is called an inner lead 232; the other portion of each lead 204 exposed by the packaging material 230 is called an outer lead 234.

The exposed outer lead 234 is bent downward for coupling to a printed circuit board (PBC) 236.

The multi-chip package in the invention can package two or more chips together; thus, performance can be enhanced without increasing capital expenditure. For example, in dynamic random access memory (DRAM), a 64M DRAM module is much cheaper than a 128M DRAM module. If a 128M DRAM module is formed by stacking two 64M DRAM modules, it is similar in performance to a single 128M DRAM module but the manufacturing cost is less than that of the single 128M DRAM module. The invention can enhance performance without increasing manufacturing costs.

In the preferred embodiment of the invention, two chips are packaged together. For example, when this structure is employed in DRAM, the memory density is doubled; that is, the invention performs as a 128M DRAM. Thus, device integration is increased, and performance of the memory is increased without re-designing and manufacturing a wafer. Therefore, the invention can be rapidly introduced into the market. Due to a reduction in the distance between devices, transmission speed is increased, and device performance is also enhanced.

The invention can be applied in a logic device, a flash memory, or other devices. Chips with different function are packaged together so as to increase function of a package.

The invention uses a die pad whose surface area is smaller than that of a chip to serve as a carrier. Thus, when the front surface having the bonding pads of the first chip is attached to the die pad, the bonding pads on the first chip are exposed. Therefore, the first chip and the second chip are mounted with the same direction so that wires need not cross to achieve electrical connection. Thus, bonding pads on chips do not need mirror re-distribution, and an additional interposer is not needed. That is, any additional treatment is unnecessary for chips. Therefore, chips with the same layout can be used. Capital expenditure is low.

Additionally, the method of manufacturing the multi-chip package in the invention is easily combined with current package technology.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-chip semiconductor package, comprising:

a first chip having a first surface and a second surface, the first surface having a plurality of first bonding pads;

a second chip having a third surface and a fourth surface, the third surface having a plurality of second bonding pads;

a lead frame comprising a die pad and a plurality of leads, the die pad having a fifth surface and a sixth surface, and the leads have an inner portion and an outer portion, wherein the fifth surface is attached to the second surface, and the sixth surface is attached to the third surface, and the die pad has an area smaller than that of the first chip and the second chip so as to expose the second bonding pads;

a plurality of wires, respectively coupling the first bonding pads and the second bonding pads to the inner portion of the leads; and a packaging material in which the first chip, the second chip, and the inner portion of the leads are sealed.

2. The multi-chip semiconductor package of claim 1, wherein the first chip and the second chip are identical.

3. The multi-chip semiconductor package of claim 1, wherein the first chip and the second chip are different.

4. The multi-chip semiconductor package of claim 1, wherein the inner portion of the leads is bent downward so that ends of the inner leads are seated on a first plane which is near the fourth surface, and the first bonding pads and the second bonding pads are respectively coupled to the first plane of the ends of the inner leads by wires.

5. The multi-chip semiconductor package of claim 1, wherein the first chip and the second chip are fixed to the die pad by a die-attaching material.

6. The multi-chip semiconductor package of claim 5, wherein the die-attaching material comprises epoxy.

7. The multi-chip semiconductor package of claim 1, wherein the first chip and the second chip are fixed to the die pad by tapes.

8. The multi-chip semiconductor package of claim 1, wherein the outer portion of the leads is coupled to a printed circuit board.

* * * * *